United States Patent [19]

Wang et al.

[11] Patent Number: 5,682,152
[45] Date of Patent: Oct. 28, 1997

[54] DATA COMPRESSION USING ADAPTIVE BIT ALLOCATION AND HYBRID LOSSLESS ENTROPY ENCODING

[75] Inventors: Zhengrong Wang, Santa Ana; Paul Steven Houle, Costa Mesa, both of Calif.

[73] Assignee: Johnson-Grace Company, Newport Beach, Calif.

[21] Appl. No.: 618,368

[22] Filed: Mar. 19, 1996

[51] Int. Cl.$^6$ .................................. H04N 7/00; H04N 7/50
[52] U.S. Cl. ................................................ 341/50; 348/403
[58] Field of Search ...................... 341/50, 51; 348/403; 358/261.1; 382/244, 245

[56] References Cited

U.S. PATENT DOCUMENTS

| | | | |
|---|---|---|---|
| 5,101,446 | 3/1992 | Resnikoff et al. | 382/56 |
| 5,420,636 | 5/1995 | Kojima | 348/403 |
| 5,552,832 | 9/1996 | Astle | 348/420 |
| 5,555,511 | 9/1996 | Ooi | 364/514 |

*Primary Examiner*—Jeffrey A. Gaffin
*Assistant Examiner*—Peguy JeanPierre
*Attorney, Agent, or Firm*—Fish & Richardson P.C.

[57] ABSTRACT

A method and apparatus for adaptive bit allocation and hybrid lossless entropy encoding in a lossy compression system. The invention includes three components: (1) a transform stage to decorrelate image data into a baseband and multiple subbands, (2) a quantization stage to quantize the resulting transform coefficients, and (3) a lossless entropy coder stage to encode the quantized indexes. In the preferred embodiment, the transform stage uses a wavelet transform algorithm. The quantization stage adaptively estimates values for parameters defining an approximation between quantization size and the logarithm of quantization error, and recursively calculates the optimal quantization size for each band to achieve a desired bit rate. The baseband and subbands are transformed into quantization matrices using the corresponding quantization sizes. The lossless entropy coder stage uses the observation that the entropy property of run lengths of zero index values in the subband quantization matrices is different from the entropy property of non-zero indices. Each quantization matrix is parsed so that each non-zero index is extracted into a separate stream, and the remaining position information is parsed into an odd stream of run length values for "0" and an even stream of run length values for "1". These three streams are Huffman coded separately in conventional fashion. This hybrid algorithm gives an approximately 10% percent improvement over conventional run length and Huffman coding for similar images. The overall compression algorithm gives about 2~6 dB improvement in terms of peak signal-to-noise ratio (PSNR) over JPEG algorithms for similar images at similar bit rates.

16 Claims, 3 Drawing Sheets

DATA COMPRESSION USING ADAPTIVE BIT ALLOCATION AND HYBRID LOSSLESS ENTROPY ENCODING

BACKGROUND OF THE INVENTION

1. Field of the Invention

This invention relates to data compression, and more particularly to data compression using adaptive bit allocation and hybrid lossless entropy encoding.

2. Description of Related Art

A number of methods exist for compressing data. These methods are characterized as either "lossy" or "lossless". Lossy compression can achieve substantial compression ratios by, in effect, omitting redundant or unimportant information while still maintaining a reasonable semblance to the original data. Since data is lost, lossy compression is normally used only for data, such as sound or graphics (still or motion), that can be perceived reasonably accurately despite the loss of information. Lossless compression generally results in lower compression ratios but can reconstitute the original data in its entirety. Thus, lossless compression is generally used for machine code, text, and numerical data that require perfect precision.

A number of different methods exist for performing lossy compression, including the well-known JPEG standard for graphics and MPEG standard for video. However, no one particular compression algorithm has been shown to be optimal for all data content. Matching an algorithm to particular data (e.g., graphics images) can achieve higher compression ratios. In some contexts, such as transmission of data over a constrained bandwidth (e.g., typical modems, LANs, or WANs), an improvement in compression ratio by even a few percent can achieve substantial long-term savings.

Accordingly, a need exists for improved data compression algorithms, particularly for lossy compression of graphics images. The present invention provides such an improved lossy compression algorithm that is particularly efficient for compressing graphics images.

SUMMARY OF THE INVENTION

The invention comprises a method and apparatus for adaptive bit allocation and hybrid lossless entropy encoding in a lossy compression system. The preferred embodiment of the compression algorithm of the present invention includes three components: (1) a transform stage to decorrelate image data into a baseband and multiple subbands, (2) a quantization stage to quantize the resulting transform coefficients, and (3) a lossless entropy coder stage to encode the quantized indexes. Decompression is accomplished by inverting the compression stages.

In the preferred embodiment, the transform stage uses a wavelet transform algorithm. However, other transforms may be used, such as the well-known discrete cosine transform (DCT) algorithm. The quantization stage recursively and adaptively estimates the optimal quantization size for each band using an approximation between quantization size and quantization error. More particularly, the quantization stage adaptively estimates values for parameters defining an approximation between quantization size and the logarithm of quantization error, and recursively calculates the optimal quantization size for each band to achieve a desired bit rate. The baseband and subbands are then transformed into quantization matrices using the corresponding quantization sizes.

The lossless entropy coder stage takes advantage of the observation that the entropy property of run lengths of zero index values in the subband quantization matrices generated by the present invention is different from the entropy property of non-zero indices. Accordingly, a hybrid entropy coding algorithm was developed. In particular, each quantization matrix is parsed so that (1) the position of each non-zero index is replaced by the special token "1", and (2) each non-zero index is extracted and put in a separate stream. This results in a simple binary mask matrix that indicates the position of each non-zero index in each subband, and a stream of the non-zero indices. The binary mask is then processed using conventional run length coding (including coding the run length of the "1" tokens) to generate a run length coded matrix. Since the binary mask is only bi-valued, the run lengths of "0" and "1" alternate. This pattern is parsed into an odd stream of run length values for "0" and an even stream of run length values for "1". The result of this process is that the quantization matrix for each subband is divided into three streams (a non-zero stream, a "0" run length stream, and a "1" run length stream), which are then Huffman coded separately in conventional fashion. This hybrid entropy coding algorithm gives an approximately 10% percent improvement over conventional run length and Huffman coding for similar images. The overall compression algorithm gives an approximately 2-6 dB improvement in terms of peak signal-to-noise ratio (PSNR) over JPEG algorithms for the same images at the same bit rates.

The details of the preferred embodiment of the present invention are set forth in the accompanying drawings and the description below. Once the details of the invention are known, numerous additional innovations and changes will become obvious to one skilled in the art.

BRIEF DESCRIPTION OF THE DRAWINGS

Like reference numbers and designations in the various drawings indicate like elements.

DETAILED DESCRIPTION OF THE INVENTION

Throughout this description, the preferred embodiment and examples shown should be considered as exemplars, rather than as limitations on the present invention.

Overview

Figure 1:
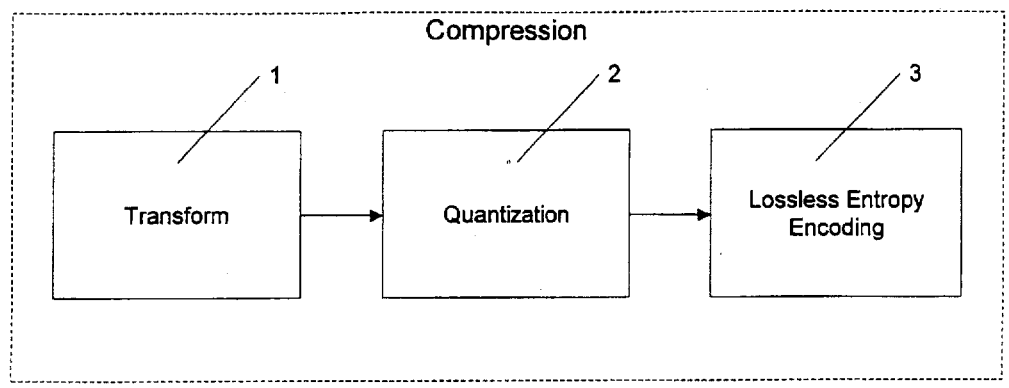
FIG. 1 is a block diagram of the three components comprising a compression encoder in accordance with the present invention.

The preferred embodiment of the compression algorithm of the present invention comprises three components, as shown in FIG. 1: (1) a transform stage 1 to decorrelate image data, (2) a quantization stage 2 to quantize the resulting transform coefficients, and (3) a lossless entropy coder stage 3 to encode the quantized indexes. Decompression is accomplished by inverting the compression stages.

In the preferred embodiment, the transform stage uses a wavelet transform algorithm. However, other transforms may be used, such as the well-known discrete cosine transform (DCT) algorithm. For ease of understanding, this description will assume that a wavelet transform algorithm is used.

(1) Wavelet Transform

Wavelet transforms are relatively new mathematical tools. A general wavelet transform can effectively decorrelate image data by decomposing an image into a number of easily compressible sub-images which contain high frequency (or edge) information. In the preferred embodiment, a wavelet transform is used in multiple levels to decompose an image. Each level of wavelet transform decomposes the image into four quarter-size sub-images, in known fashion.

Figure 2:
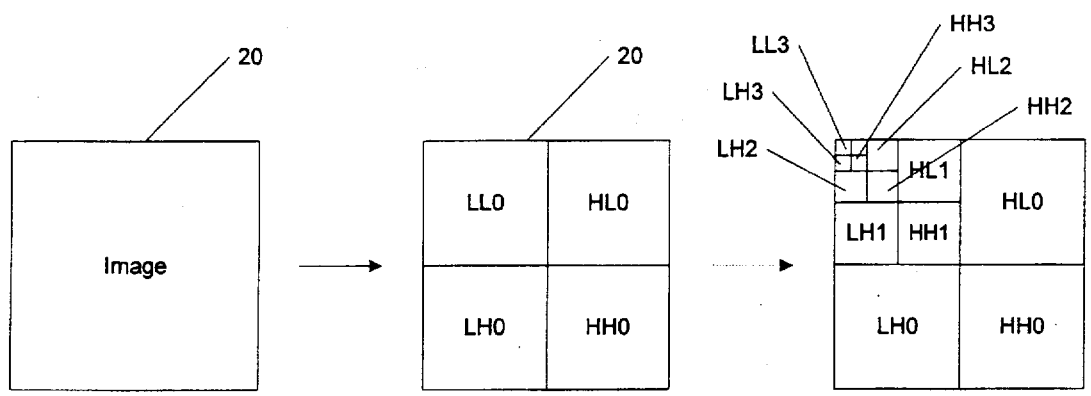
FIG. 2 is a block diagram showing multi-level decomposition of an image.

For example, referring to FIG. 2, an image 20 comprising a two-dimensional matrix of numbers representing pixels is decomposed in the transform stage 1 into four quarter-size sub-images LL0, HL0, LH0, and HH0 by application of a wavelet transform. Then, as indicated by the dotted line, the wavelet transform is applied to the LL0 sub-image to derive LL1, HL1, LH1, and HH1 sub-images, and then again is applied to the LL1 sub-image to derive LL2, HL2, LH2, and HH2 sub-images, and then once more is applied to the LL2 sub-image to derive LL3, HL3, LH3, and HH3 sub-images.

In the example shown in FIG. 2, the fourth level sub-image LL3 is called the baseband image, and resembles a shrunken version of the original image 20 that is $1/256$ of the size of the original image 20. The 12 remaining sub-images (referred to as "subband images" or just "subbands") supplement the difference between the baseband image and the original image 20. More particularly, the subband images represent edge information in the horizontal, vertical, and diagonal (labeled as HL, LH, HH) orientations.

As a result of the preferred four level wavelet decomposition, the image 20 is decomposed into one baseband image LL3 and twelve subband images (HL0-3, LH0-3, and HH0-3). If desired, the baseband image shown can be further decomposed in a similar fashion several layers down, resulting in a similar pyramid structure with additional subbands.

A beneficial characteristic of wavelet transform subbands is that the data comprising each subband is very sparse and most pixel values are very close to zero. This characteristic leads to improved quantization and lossless entropy encoding in accordance with the present invention.

In the preferred embodiment, the implementation of the wavelet transform is achieved by using a pair of carefully designed wavelet filters. Among the many possible wavelet filters, the preferred embodiment of the present invention uses Daubechies's 7 and 9 biorthogonal filters as the wavelet filters. These filters are implemented using a straightforward finite impulse response (FIR) implementation, in known fashion.

(2) Quantization

Figure 3:
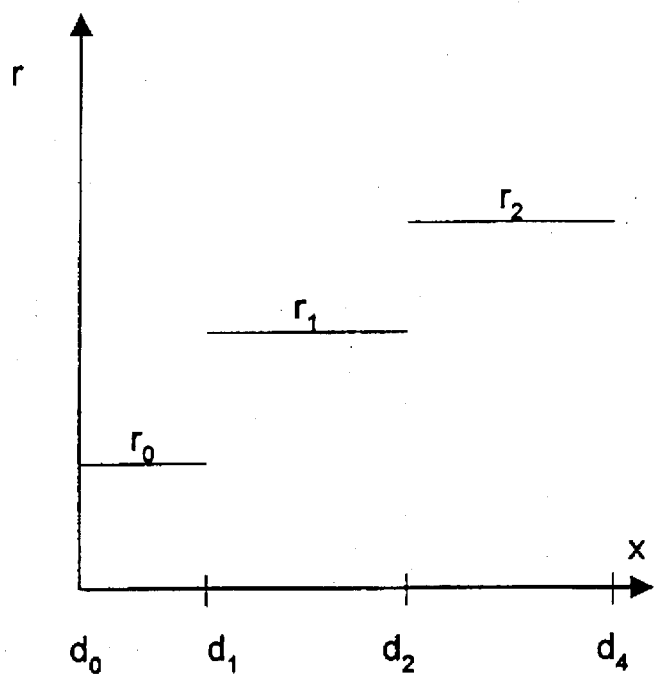
FIG. 3 is a diagram showing a quantization function that maps all x values in the interval $d_1$ to $d_2$ to the value $r_1$.

Quantization discards imperceptible information in baseband and subband images to achieve compression to meet a bit rate requirement from a user. A quantizer is a "many to one" function Q(x) which maps many input values into a smaller set of output values. Quantizers are a staircase function characterized by a set of numbers called decision points $d_i$ and a set of numbers called reconstruction levels $r_i$. An input value x is mapped to a reconstruction level $r_i$ if x lies the interval of ($d_i$, $d_{i+1}$). For example, FIG. 3 is a diagram showing the mapping of all x values in the interval $d_1$ to $d_2$ to the value $r_1$. The interval $d_i$ to $d_{i+1}$ may not be uniform for all i.

In the preferred embodiment, since the wavelet transform does a good job of decorrelating the image data in general, a uniform scalar quantizer is used in the quantization stage 2. The equation for the preferred uniform scalar quantization is:

$$r = \begin{cases} \left[\dfrac{x+q_i}{q_i}\right] - 1, & x < -\dfrac{q_i}{2} \\ [0, \text{otherwise}] \\ \left[\dfrac{x-q_i}{q_i}\right] + 1, & x > \dfrac{q_i}{2} \end{cases} \quad (1)$$

where $q_i$ is the quantization size for subband i.

Figure 4:
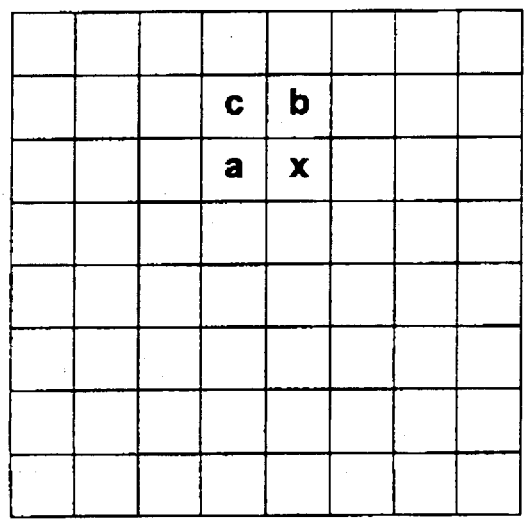
FIG. 4 is a diagram showing application of a differential pulse code modulation algorithm to a current pixel x.

In addition, since there is still a high degree of correlation among neighboring pixels in the baseband image, differential pulse code modulation (DPCM) is used to predict and quantize the baseband data further. In particular, in the preferred embodiment, the baseband image is scanned row by row from top to bottom and each pixel is subjected to the DPCM algorithm. For example, FIG. 4 shows a current pixel x that is predicted using three neighboring pixels a, b, c, which have already been quantized. A simple prediction is used in the preferred embodiment. In particular, the prediction residue r is calculated by:

$$r = x - a^* - b^* + c^* \quad (2)$$

where $a^*$, $b^*$, $c^*$ are reconstruction (or "de-quantized") levels for a, b, c. The prediction residue r is then passed through a uniform scalar quantizer, such as the one shown in Equation (1).

Subband images represent edge information under different orientation of different levels. Thus, each subband will have a separate quantization size according to the statistical properties of such subband. The procedure for determining an optimal quantization size is called bit allocation. The present invention includes a novel adaptive bit allocation scheme described in detail below.

As a result of the preferred quantization stage, the baseband and 12 subband images are each processed into a quantization matrix of reconstruction levels $r_i$, or quantization indices.

(3) Lossless Entropy Coding

The final compression is achieved by losslessly encoding the quantization matrix for each subband in the lossless entropy coder stage 3. The lossless entropy coder stage 3 assigns a variable size token to each quantization index according to the frequency with which that index appears; the more frequently a particular index appears, the shorter the token assigned to it. The preferred embodiment of the present invention uses the well-known Huffman coding technique to encode the data in each subband quantization matrix. In the prior art, since a majority of the indices in each subband quantization matrix are zero-valued, conventional run length coding of each matrix would normally be performed before Huffman coding. Run length coding simply replaces a sequence of like-valued data values with a symbol representing the data value and the number of such values in the sequence.

The output of the lossless entropy coder stage 3 is a data structure that represents a compressed version of the original image 20. That data structure may be transmitted and/or stored for later reconstitution into an image that approximates the original image 20.

Based on extensive empirical analysis in developing the present invention, it has been observed that the entropy property (i.e., randomness) of run lengths of zero index values in the subband quantization matrices generated by the present invention is different from the entropy property of non-zero indices. Accordingly, a hybrid entropy coding algorithm was developed which gives an approximately 10% percent improvement over the conventional run length and Huffman coding approach. This hybrid entropy coding algorithm is described in detail below.

Bit Allocation

Bit allocation is a process of determining the quantization size for baseband and subband images so that the overall quantization error approximates a minimum under the constraint of a total bit rate set by a user. Determining such minimums is a typical programming problem in mathematics. One could write:

$$\min_{R_k} \sum_{k=1}^{n} \frac{1}{m_k} D_k(R_k) \qquad (3)$$

under the condition:

$$\sum_{k=1}^{n} \frac{1}{m_k} R_k = R_{total} \qquad (4)$$

where: $D_k(R_k)$ and $R_k$ are the distortion (quantization error) and the bit rate for the baseband image and each subband image, respectively; $R_{total}$ is a selected total bit rate; and $m_k$ is the down sample factor, which is to be the ratio of image size to subband size (for example, for the decomposition structure shown in FIG. 2, $m_{LH1}=16$, $m_{LH3}=256$). The solution of Equation (3) can be found by a Lagrange multiplier method:

$$\min_{R_k} (J) = \min_{R_k} \left( \sum_{k=1}^{n} \frac{1}{m_k} D_k(R_k) + \lambda \left( R_{total} - \left( \sum_{k=1}^{n} \frac{1}{m_k} R_k \right) \right) \right) \qquad (5)$$

where J is the overall cost function, and $\lambda$ is the Lagrange multiplier. The minimum of J is achieved when the first partial derivative of J equals zero. This condition yields:

$$\frac{\partial J}{\partial R_i} = \frac{\partial D_i(R_i)}{\partial R_i} = \lambda \qquad (6)$$

for all subbands i. To solve Equation (6), the explicit expression of $D_k(R_k)$ needs to be known. However, in practice, it is hard to find the explicit expression for $D_k(R_k)$ for each subband.

It is known that the probability distribution function (PDF) of subband data can be approximated by a Generalized Gaussian model, for which $D_k(R_k)$ is known. This approach leads to allocating the bit rate in proportion to the logarithm of the variance of the subband data, and is widely used in various wavelet image coding schemes. Unfortunately, carefully examination of this method shows that this method is not correct and cannot lead to optimal bit allocation. If bit rate allocation is done simply in proportion to the logarithm of the variance of the subband, this implies that, if the two subbands have the same variance, then their curve will be the same. On the contrary, based on extensive empirical analysis in developing the present invention, it has been found that the best-fit curve is quite different for subbands with the same variance.

Instead of the above method, the preferred embodiment takes advantage of the observations, made during the development of the present invention, that (1) the logarithm of the mean square error (MSE) of the quantization of a subband to the corresponding bit rate (determined by lossless coding of the quantization indices for such subband) can be approximated by a straight line, and (2) that such bit rate can be approximated from the quantization size.

Using a straight line model, the distortion (quantization error) to bit rate curve for each band can be expressed as:

$$D_k(R_k) = e^{a_k R_k + b_k} \qquad (7)$$

where $a_k$ and $b_k$ are parameters representing the line and depending on subband k. Using Equation (7), Equation (6) becomes:

$$R_k = \frac{1}{a_k} \left( \log\left( \frac{\lambda}{a_k} \right) - b_k \right) \qquad (8)$$

Under the constraint of the total bit rate $R_{total}$, this results in:

$$\sum_{k=1}^{n} \frac{1}{m_k} R_k = \log(\lambda) \sum_{k=1}^{n} \frac{1}{m_k a_k} - \sum_{k=1}^{n} \left( \frac{b_k}{m_k a_k} + \frac{\log(a_k)}{m_k a_k} \right) = R_{total} \qquad (9)$$

From Equation (9):

$$\lambda = \exp\left( \frac{R_{total} + \sum_{k=1}^{n} \left( \frac{b_k}{m_k a_k} + \frac{\log(a_k)}{m_k a_k} \right)}{\sum_{k=1}^{n} \frac{1}{m_k a_k}} \right) \qquad (10)$$

From Equation (10), the subband bit rate can be derived using Equation (8). However, since the goal is to find quantization size rather than bit rate, the relationship between bit rate and quantization size must be determined. It is observed that the relationship between bit rate $R_k$ and quantization size $Q_k$ can be approximated using following equation:

$$\text{Log}\left( \frac{\text{Max}_k - \text{Min}_k}{Q_k} \right) = c_k R_k + d_k \qquad (11)$$

From Equation (11):

$$Q_k = \frac{\text{Max}_k - \text{Min}_k}{\exp(c_k R_k + d_k)} \qquad (12)$$

where: $\text{Max}_k$, $\text{Min}_k$ are the maximum and minimum coefficients of subband k; and $c_k$, and $d_k$, similar to $a_k$ and $b_k$, are constants depending on the statistical properties of subband k and can be estimated using simple curve fitting.

Using the above model, the bit allocation problem can be solved by estimating $a_k$, $b_k$, $c_k$ and $d_k$ for each subband. These estimations can be done off-line by statistically calculating the bit rate for each subband over a large number of sample images. However this may not be optimal for a particular image. Since $a_k$, $b_k$, $c_k$ and $d_k$ are parameters representing a straight line, they can easily be estimated on the fly. Suppose n points in the curve $D_k(R_k)$ are known, and also $Q_k(R_k)$, i.e., $(Q_i, D_i, R_i)$, i=1, 2, ... n, then:

$$a_k = \frac{n \sum_{i=1}^{n} R_i \log(D_i) - \sum_{i=1}^{n} R_i \sum_{i=1}^{n} \log(D_i)}{n \sum_{i=1}^{n} R_i^2 - \sum_{i=1}^{n} R_i \sum_{i=1}^{n} R_i} \qquad (13)$$

$$b_k = \frac{\sum_{i=1}^{n} \log(D_i) - a_k \sum_{i=1}^{n} R_i}{n} \qquad (14)$$

$$c_k = \frac{n \sum_{i=1}^{n} R_i \log\left( \frac{\text{Max}_k - \text{Min}_k}{Q_i} \right) - \sum_{i=1}^{n} R_i \sum_{i=1}^{n} \log\left( \frac{\text{Max}_k - \text{Min}_k}{Q_i} \right)}{n \sum_{i=1}^{n} R_i^2 - \sum_{i=1}^{n} R_i \sum_{i=1}^{n} R_i} \qquad (15)$$

$$d_k = \frac{\sum_{i=1}^{n} \text{Log}\left( \frac{\text{Max}_k - \text{Min}_k}{Q_i} \right) - c_k \sum_{i=1}^{n} R_i}{n} \qquad (16)$$

In the preferred embodiment, the set of $Q_i$ are set to have initial default values covering a reasonable range of possible quantization values. $D_i$, the distortion (error) of quantization, is calculated using Equation (1). The bit rate, $R_i$, is calculated by calling the lossless encoder routine (described below). In the preferred embodiment, n is empirically set to 6. However, other values may be used for n, as desired.

Using the above approach, the following steps are performed in the preferred embodiment of the present invention to adaptively determine bit allocations for the baseband and subband images during the quantization stage 2:

(1) Estimate values for parameters defining an approximation between quantization size and quantization error for each subband—this is, estimate $a_k$, $b_k$, $c_k$ and $d_k$ for each subband image k, using Equations (13), (14), (15), and (16). Again, $Max_k$ and $Min_k$ are the maximum and minimum coefficients of subband k, determined by searching the coefficients. Calculate an initial set of $Q_i$ from:

$$Q_i = \frac{Max_k - Min_k}{N_i} \quad (17)$$

where $N_i = \{8, 12, 15, 24, 48, 64\}$ for the first 8 subbands, and $N_i = \{8, 10, 14, 18, 36, 50\}$ for last 4 subbands. $N_i$ is the total number of quantization levels for $Q_i$. The number of bits per index is close to $Log(N_i)$ if a lossless coding technique is not used. The values for $N_i$ are empirically chosen to cover a possible range of bit rates for each subband.

(2) Estimate values for parameters defining an approximation between quantization size and quantization error for the baseband—that is, estimate $a_k$, $b_k$, $c_k$ and $d_k$ for the baseband image using Equations (13), (14), (15), and (16). Max and Min are set to 2000 and 0, respectively, for the baseband. Max and Min are fixed values for the baseband image in Equation (11) because the baseband image uses DPCM quantization. The preferred values were empirically determined. $Q_i = \{4, 10, 20, 40, 80, 100\}$. The values for $Q_i$ were empirically chosen to cover a reasonable range of $Q_i$ for the baseband image.

(3) Calculate the optimal bit rate $R_k$ for each of the baseband and subband images using Equations (8) and (10).

(4) If $R_k < 0$, indicating information in subband k is so small that it can be discarded, mark subband k and exclude it from the subband pool, and loop to step (3) and recalculate the optimal bit rates $R_k$.

(5) Calculate $Q_k$ using Equation (12). The result of this process is a set of optimal quantization size values $Q_k$ that can be used in Equation (1) (shown there as $q_i$).

Lossless Entropy Coding

In the prior art, the quantization matrices would be run length code and then Huffman coded. The present invention teaches a more efficient method of coding that gives an approximately 10% percent improvement over the conventional run length and Huffman coding approach.

Figure 5:
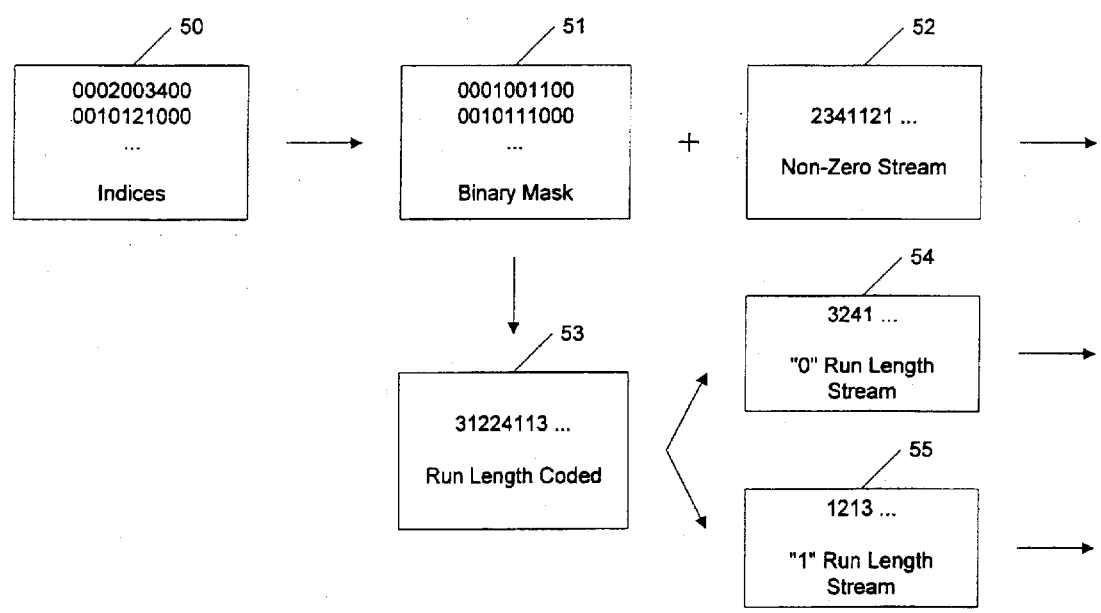
FIG. 5 is a flow chart showing the hybrid lossless entropy coding algorithm of the present invention.

FIG. 5 is a flow chart showing the hybrid lossless entropy coding algorithm of the present invention. Initially, each subband is represented at this stage by a quantization matrix 50 comprising a set of quantization indices. Each quantization matrix 50 is parsed so that (1) the position of each non-zero index is replaced by the special token "1", and (2) each non-zero index is extracted and put in a separate stream. This results in a simple binary mask matrix 51 that indicates the position of each non-zero index in each subband, and a stream 52 of the non-zero indices.

Normally, such a binary mask 51 would be harder to compress than the non-zero stream 52 because the binary mask 51 actually represents the structure information of the original image. However, it was observed during the development of the invention that the data in each subband is typically so sparse that the run lengths of "0" are very long but the run lengths of "1" are normally short. In other words, the entropy property of run lengths of "0" is different from the entropy property of run lengths of "1". Thus, it was concluded that it would be better to Huffman code the "0" run length indices and "1" run length indices separately.

Accordingly, in the preferred embodiment, the binary mask 51 is processed using conventional run length coding (including coding the run length of the "1" tokens) to generate a run length coded matrix 53. It will be noted that since the binary mask 51 is only bi-valued, the run lengths of "0" and "1" alternate. Therefore, the run length coded matrix 53 has an odd-even pattern. This pattern is parsed into two run length streams 54, 55, defining an odd stream 54 of run length values for "0" and an even stream 55 of run length values for "1". (Of course, the designation of odd and even may be reversed).

The result of this process is that the quantization matrix for each subband is divided into three streams (non-zero stream 52, "0" run length stream 54, and "1" run length stream 55), which are then Huffman coded separately in conventional fashion.

Ideally, each subband would be processed in this manner individually, since their statistical properties are different. However, for 12 subbands, 36 Huffman streams will be generated (further, for color images, each subband has three color space components, such as YUV or RGB). This is not very efficient in terms of speed and file size due to additional overhead in the file format. Empirically, it was determined that the three subbands on each level of the wavelet transform have quite similar entropy properties. Accordingly, in the preferred embodiment of the present invention, the quantization matrices of each such set of three subbands are combined together on a row-by-row basis before applying the above hybrid coding scheme. (Other combinations, such as column-by-column, could be used as well).

In the preferred embodiment, conventional run length coding followed by Huffman coding is used for the baseband because the baseband residue is not sparse and applying the above hybrid coding approach results in little or no gain in compression. However, if desired, the inventive hybrid coding algorithm could be used for the baseband as well.

Importantly, the hybrid coding algorithm may be used in any other context where a substantial difference exists in the entropy property of run lengths of "0" compared to the entropy property of run lengths of non-zero elements (which may be transformed by substitution to "1" tokens).

In the preferred embodiment, conventional run length coding plus a Huffman coding approach is used in the lossless encoder routine for coding the baseband and subbands used by the quantization stage 2 to determine the bit rate associated with a particular quantization size $Q_i$. This approach was selected in consideration of computational speed and memory limitations. However, it should be recognized that other means of determining or estimating the bit rate could be used, such as the hybrid approach described above.

Format of a Compressed Stream

In the preferred embodiment, each Huffman coded stream for the baseband and subbands, as well as other general image information, are combined together into a single bitstream. In the preferred embodiment, the final bitstream is organized in the following order to achieve progressive playback (that is, decoding the baseband portion of the bitstream for the compressed image so as to generate a first, "grainy" image, and then progressively decoding each subband portion of the bitstream to successively overlay and add resolution to the underlying image until done):

General Image Information
Y Baseband
U Baseband
V Baseband
Y Subbands 1
U Subbands 1
V Subbands 1
Y Subbands 2
U Subbands 2
V Subbands 2
Y Subbands 3
U Subbands 3
V Subbands 3
Y Subbands 4
U Subbands 4
V Subbands 4

General Image Information

The general image information includes information about the dimension of the image and color space, and comprises the following components in the preferred embodiment:

| Component | Function |
|---|---|
| 1 | Wavelet Stream ID (0 × 15) |
| 2 | Color Space (0 × 20 for grayscale image, 0 × 03 for YUV image) |
| 3 | Columns low byte |
| 4 | Columns high byte |
| 5 | Rows low byte |
| 6 | Rows high byte |

Baseband Stream

Each baseband stream (i.e., one for each color) comprises a bitstream including the following components in the preferred embodiment:

| Component | Function |
|---|---|
| 1 | Quantization Size: 1 or 2 bytes |
| 2 | Huffman Bit Stream for baseband |

Subbands Stream

Each subband stream comprises a bitstream for each color of three subbands corresponding to each level of the preferred wavelet transform, and includes the following components in the preferred embodiment:

| Component | Function |
|---|---|
| 1 | No. of bytes for non-zero index stream in current level (1 or 2 bytes) |
| 2 | No. of bytes for "1" run length stream in current level (1 or 2 bytes) |
| 3 | Level information (1 byte): lowest 3 bits indicate if the subband was discarded |
| 4 | Quantization size for LH subband if not discarded (1 or 2 bytes) |
| 5 | Quantization size of HL subband if not discarded (1 or 2 bytes) |
| 6 | Quantization size of HH subband if not discarded (1 or 2 bytes) |
| 7 | Huffman stream for non-zero index |
| 8 | Huffman stream for "1" run length |
| 9 | Huffman stream for "0" run length |

Decoding

Decoding of a bitstream encoded with the present invention is straightforward, and may be accomplished as follows:

(1) Decode the Huffman streams;

(2) For each subband, rebuild a binary mask by interleaving and expanding the "0" run length streams and "1" run length streams;

(3) Rebuild the corresponding quantization matrix from the binary mask and the non-zero stream by sequentially substituting the non-zero values for "1"; tokens (this may be combined with step (2));

(4) Apply the corresponding quantization size values to each quantization matrix in known fashion to generate the baseband image and subband images; (5) Apply the inverse transform in known fashion to the baseband image and subband images to generate an approximation of the original image.

The decoded images in the baseband level and each subband level from step (5) may be displayed before decoding the next level, thereby permitting progressive playback.

Implementation

The invention may be implemented in hardware or software, or a combination of both. However, preferably, the invention is implemented in one or more computer programs executing on one or more programmable computers each comprising a processor, a data storage system (including volatile and non-volatile memory and/or storage elements), at least one input device, and at least one output device. Program code is applied to input data to perform the functions described herein and generate output information. The output information is applied to one or more output devices, in known fashion.

Each program is preferably implemented in a high level procedural or object oriented programming language to communicate with a computer system. However, the programs can be implemented in assembly or machine language, if desired. In any case, the language may be a compiled or interpreted language.

Each such computer program is preferably stored on a storage media or device (e.g., ROM or magnetic diskette) readable by a general or special purpose programmable computer, for configuring and operating the computer when the storage media or device is read by the computer to perform the procedures described herein. The inventive system may also be considered to be implemented as a computer-readable storage medium, configured with a computer program, where the storage medium so configured causes a computer to operate in a specific and predefined manner to perform the functions described herein.

A number of embodiments of the present invention have been described. Nevertheless, it will be understood that various modifications may be made without departing from the spirit and scope of the invention. For example, while the term "matrix" has been used to describe an image data structure, it should not be interpreted to mean a strict two-dimensional data structure. Other data structures known in the art can as easily be used to store the relevant pixel or index information. Further, while Huffman coding has been referred to as the preferred method for the final lossless entropy coding step, other lossless entropy coding algorithms, such as arithmetic coding, may be used. Moreover, while image compression has been discussed, the algorithms described herein may be applied to other data types. Accordingly, it is to be understood that the invention is not to be limited by the specific illustrated embodiment, but only by the scope of the appended claims.

What is claimed is:

1. A hybrid lossless entropy coding method for compressing data comprising a matrix including a plurality of zero indices and non-zero indices, the method including the steps of:
   (a) replacing each non-zero index in the matrix by a unique token, thereby generating a parsed matrix including a plurality of zero indices and token indices;
   (b) placing each non-zero index from the matrix into a first data stream;
   (c) run length coding the parsed matrix into alternating run length codes for the zero indices and unique token indices;
   (d) placing the even run length codes into a second data stream;
   (e) placing the odd run length codes into a third data stream; and
   (f) coding each of the first, second, and third data streams with a lossless entropy coding algorithm.

2. A hybrid lossless entropy coding method for compressing data, the method being implemented in a programmed computer comprising a processor, a data storage system, and at least one output device, the method including the steps of:
   (a) storing data in the data storage system of the programmed computer, the data comprising a matrix including a plurality of zero indices and non-zero indices;
   (b) replacing each non-zero index in the matrix by a unique token using the processor, thereby generating a parsed matrix including a plurality of zero indices and token indices;
   (c) placing each non-zero index from the matrix into a first data stream using the processor;
   (d) run length coding the parsed matrix using the processor into alternating run length codes for the zero indices and unique token indices;
   (e) placing the even run length codes into a second data stream using the processor;
   (f) placing the odd run length codes into a third data stream using the processor;
   (g) coding each of the first, second, and third data streams with a lossless entropy coding algorithm using the processor to thereby generate output information; and
   (h) applying the output information to at least one of the output devices.

3. The method of claims 1 or 2, wherein the unique token is "1".

4. The method of claims 1 or 2, wherein the lossless entropy coding algorithm is Huffman coding.

5. The method of claims 1 or 2, wherein the lossless entropy coding algorithm is arithmetic coding.

6. The method of claims 1 or 2, wherein the matrix comprises quantization indices derived from an image by a lossy data compression and quantization system.

7. A computer program for compressing data using a hybrid lossless entropy coding algorithm, the data comprising a matrix including a plurality of zero indices and non-zero indices, the computer program being stored on a media readable by a computer system, for configuring the computer system upon being read and executed by the computer system to perform the functions of:
   (a) replacing each non-zero index in the matrix by a unique token, thereby generating a parsed matrix including a plurality of zero indices and token indices;
   (b) placing each non-zero index from the matrix into a first data stream;
   (c) run length coding the parsed matrix into alternating run length codes for the zero indices and unique token indices;
   (d) placing the even run length codes into a second data stream;
   (e) placing the odd run length codes into a third data stream; and
   (f) coding each of the first, second, and third data streams with a lossless entropy coding algorithm.

8. A computer-readable storage medium, configured with a computer program for compressing data using a hybrid lossless entropy coding algorithm, the data comprising a matrix including a plurality of zero indices and non-zero indices, where the storage medium so configured causes a computer to operate in a specific and predefined manner to perform the functions of:
   (a) replacing each non-zero index in the matrix by a unique token, thereby generating a parsed matrix including a plurality of zero indices and token indices;
   (b) placing each non-zero index from the matrix into a first data stream;
   (c) run length coding the parsed matrix into alternating run length codes for the zero indices and unique token indices;
   (d) placing the even run length codes into a second data stream;
   (e) placing the odd run length codes into a third data stream; and
   (f) coding each of the first, second, and third data streams with a lossless entropy coding algorithm.

9. The invention of claims 7 or 8, wherein the unique token is "1".

10. The invention of claims 7 or 8, wherein the lossless entropy coding algorithm is Huffman coding.

11. The invention of claims 7 or 8, wherein the lossless entropy coding algorithm is arithmetic coding.

12. The invention of claims 7 or 8, wherein the matrix comprises quantization indices derived from an image by a lossy data compression and quantization system.

13. A method for compressing image data, comprising the steps of:
   (a) storing an image in a computer as image data;
   (b) applying a transform algorithm to decorrelate the image data into a baseband and multiple subbands;
   (c) generating quantization coefficients by the steps of:
      (1) adaptively estimating values for parameters defining an approximation between quantization size and the logarithm of quantization error for each such band;
      (2) recursively calculating an optimal quantization size for each of the baseband and multiple subbands to achieve a desired bit rate;
   (d) applying the quantization coefficients to the baseband and multiple subbands to generate corresponding quantization matrices each comprising a plurality of zero indices and non-zero indices;
   (e) applying a hybrid lossless entropy coding algorithm to losslessly compress each quantization matrix.

14. A computer program for compressing image data, the computer program being stored on a media readable by a computer system, for configuring the computer system upon being read and executed by the computer system to perform the functions of:

(a) storing an image in a computer as image data;
(b) applying a transform algorithm to decorrelate the image data into a baseband and multiple subbands;
(c) generating quantization coefficients by the steps of:
  (1) adaptively estimating values for parameters defining an approximation between quantization size and the logarithm of quantization error for each such band;
  (2) recursively calculating an optimal quantization size for each of the baseband and multiple subbands to achieve a desired bit rate;
(d) applying the quantization coefficients to the baseband and multiple subbands to generate corresponding quantization matrices each comprising a plurality of zero indices and non-zero indices;
(e) applying a hybrid lossless entropy coding algorithm to losslessly compress each quantization matrix.

15. A method for compressing image data, comprising the steps of:
(a) storing an image in a computer as image data;
(b) applying a transform algorithm to decorrelate the image data into a baseband and multiple subbands;
(c) generating quantization coefficients by the steps of:
  (1) estimating values for parameters defining an approximation between quantization size and the logarithm of quantization error for each subband;
  (2) estimating values for parameters defining an approximation between quantization size and the logarithm of quantization error for the baseband;
  (3) calculating an optimal bit rate $R_k$ for each of the baseband and subbands;
  (4) marking each subband k and excluding it from the subbands if $R_k<0$ for such subband k, and then looping to step (3);
  (5) calculating a quantization size $Q_k$ for each of the baseband and subbands as:

$$Q_k = \frac{Max_k - Min_k}{\exp(c_k R_k + d_k)}$$

(d) applying each quantization size $Q_k$ to corresponding ones of the baseband and multiple subbands to generate corresponding quantization matrices each comprising a plurality of zero indices and non-zero indices;
(e) applying a hybrid lossless entropy coding algorithm to losslessly compress each quantization matrix by the steps of:
  (1) replacing each non-zero index in the quantization matrix by a unique token, thereby generating a parsed matrix including a plurality of zero indices and token indices;
  (2) placing each non-zero index from the quantization matrix into a first data stream;
  (3) run length coding the parsed matrix into alternating run length codes for the zero indices and unique token indices;
  (4) placing the even run length codes into a second data stream;
  (5) placing the odd run length codes into a third data stream; and
  (6) coding each of the first, second, and third data streams with a lossless entropy coding algorithm.

16. A computer program for compressing image data, the computer program being stored on a media readable by a computer system, for configuring the computer system upon being read and executed by the computer system to perform the functions of:
(a) storing an image in a computer as image data;
(b) applying a transform algorithm to decorrelate the image data into a baseband and multiple subbands;
(c) generating quantization coefficients by the steps of:
  (1) estimating values for parameters defining an approximation between quantization size and the logarithm of quantization error quantization error for each subband;
  (2) estimating values for parameters defining an approximation between quantization size and the logarithm of quantization error for the baseband;
  (3) calculating an optimal bit rate $R_k$ for each of the baseband and subbands;
  (4) marking each subband k and excluding it from the subbands if $R_k<0$ for such subband k, and then looping to step (3);
  (5) calculating a quantization size $Q_k$ for each of the baseband and subbands as:

$$Q_k = \frac{Max_k - Min_k}{\exp(c_k R_k + d_k)}$$

(d) applying each quantization size $Q_k$ to corresponding ones of the baseband and multiple subbands to generate corresponding quantization matrices each comprising a plurality of zero indices and non-zero indices;
(e) applying a hybrid lossless entropy coding algorithm to losslessly compress each quantization matrix by the steps of:
  (1) replacing each non-zero index in the quantization matrix by a unique token, thereby generating a parsed matrix including a plurality of zero indices and token indices;
  (2) placing each non-zero index from the quantization matrix into a first data stream;
  (3) run length coding the parsed matrix into alternating run length codes for the zero indices and unique token indices;
  (4) placing the even run length codes into a second data stream;
  (5) placing the odd run length codes into a third data stream; and
  (6) coding each of the first, second, and third data streams with a lossless entropy coding algorithm.

* * * * *